United States Patent [19]

Sano

[11] Patent Number: 5,270,847
[45] Date of Patent: Dec. 14, 1993

[54] LIQUID CRYSTAL DISPLAY PANEL ASSEMBLY WITH RESILIENT DISPLAY PANEL SUPPORT

[75] Inventor: Masaki Sano, Chiba, Japan

[73] Assignee: Asahi Kogaku Kogyo Kabushiki Kaisha, Tokyo, Japan

[21] Appl. No.: 953,796

[22] Filed: Sep. 30, 1992

[30] Foreign Application Priority Data

Sep. 30, 1991 [JP] Japan .................. 3-100070[U]

[51] Int. Cl.⁵ .................. G02F 1/1333; G02F 1/1343
[52] U.S. Cl. ........................................... 359/83; 359/88
[58] Field of Search .......................... 359/83, 88

[56] References Cited

U.S. PATENT DOCUMENTS

| | | | |
|---|---|---|---|
| 3,966,304 | 6/1976 | Kakeda | 359/78 |
| 4,789,224 | 12/1988 | Bougsty | 359/83 |
| 5,026,145 | 6/1991 | Marui et al. | 353/114 |
| 5,062,692 | 11/1991 | Marui et al. | 359/45 |
| 5,078,474 | 1/1992 | Marui et al. | 359/40 |
| 5,121,232 | 6/1992 | Miyadera | 359/49 |
| 5,146,390 | 9/1992 | Wong | 359/83 |
| 5,166,815 | 11/1992 | Elderfield | 359/83 |

FOREIGN PATENT DOCUMENTS

58-223121 12/1983 Japan ............................ 359/83

*Primary Examiner*—William L. Sikes
*Assistant Examiner*—Ron Trice
*Attorney, Agent, or Firm*—Sandler Greenblum & Bernstein

[57] ABSTRACT

A liquid crystal display panel is housed in a frame and has a first group of leads disposed on an edge thereof. The frame is supported on a printed-circuit board which has a driver circuit for energizing the liquid crystal display panel, the printed-circuit board having a second group of leads. An electrically conductive resilient spacer is disposed between the liquid crystal display panel and the printed-circuit board. The first and second groups of leads are electrically connected to each other by the electrically conductive spacer. The edge of the liquid crystal display panel is resiliently pressed against the holder bezel by the electrically conductive resilient spacer. A display panel support positioned in the frame and mounted on the printed-circuit board has a base integrally joined to the frame and a resilient wing extending from the base. The liquid crystal display panel is resiliently pressed against the holder bezel remotely from the first group of leads by the resilient wing.

10 Claims, 3 Drawing Sheets

LIQUID CRYSTAL DISPLAY PANEL ASSEMBLY WITH RESILIENT DISPLAY PANEL SUPPORT

BACKGROUND OF THE INVENTION

The present invention relates to a liquid crystal display panel assembly having a resilient display panel support which holds a liquid crystal display panel securely in position within a frame.

Many electronic devices, precision instruments, and other devices which require user information to be displayed incorporate liquid crystal display panels for displaying various items of desired information (e.g., modes of function, time, data, etc.).

One conventional liquid crystal display panel assembly is shown in FIG. 1 of the accompanying drawings. As shown in FIG. 1, the conventional liquid crystal display panel assembly generally comprises a liquid crystal display panel 41 and a printed-circuit board 43 that includes a liquid crystal driver circuit for energizing the liquid crystal display panel 41 to display information.

The liquid crystal display panel 41 is housed in a centrally open rectangular frame 45 fixedly mounted on the printed-circuit board 43. A bottom plate 46, which is integral with the frame 45, is positioned between the liquid crystal display panel 41 and the printed-circuit board 43. The liquid crystal display panel 41 is held securely between the bottom plate 46 and a centrally open rectangular holder bezel 47, of L-shaped cross section, which is mounted on an upper surface of the frame 45. The bottom plate 46, which is integral with the frame 45 makes the frame 45, rigid against strains. Therefore, the liquid crystal display panel 41 is protected from undesirable distortions or deformations.

The liquid crystal display panel 41 has a group of leads 49 on the lower surface of one edge thereof, and the printed-circuit board 43 also has a group of leads 51 on the upper surface thereof in vertical alignment with the leads 49. Between the leads 49 and the leads 51, there is disposed a connector or spacer 53 of electrically conductive rubber that resiliently presses the liquid crystal display panel 41 against an inner peripheral edge of the holder bezel 47 which extends inwardly of the frame 45. The leads 49 and the leads 51 are held in electrical contact with each other through the electrically conductive rubber spacer or connector 53.

The electrically conductive rubber spacer or connector 53 is positioned on one side of the bottom plate 46. A dummy connector or spacer 55 of rubber is positioned on the other side of the bottom plate 46 and disposed between the liquid crystal display panel 41 and the printed-circuit board 43. The spacer 55 serves to press the edge of the liquid crystal display panel 41 which is remote from the leads 49, against an inner peripheral edge of the holder bezel 47, which extends inwardly of the frame 45, so that the liquid crystal display panel 41 is resiliently pressed upwardly against the holder bezel 47 on its opposite sides by the resilient spacers 53, 55. The spacers 53, 55 are held in position by the bottom plate 46 against displacement toward each other.

Since the additional spacer or connector is required, the conventional liquid crystal display panel assembly shown in FIG. 1 is disadvantageous for various reasons. Specifically, the liquid crystal display panel assembly is made up of a relatively large number of parts, cannot be assembled with ease, and, as a result, is relatively expensive to manufacture.

SUMMARY OF THE INVENTION

It is therefore an object of the present invention to provide a liquid crystal display panel assembly which is composed of a relatively small number of parts, can be assembled easily, and is relatively inexpensive to manufacture.

According to a first aspect of the present invention, there is provided a liquid crystal display panel assembly comprising a frame, a liquid crystal display panel housed in the frame, the liquid crystal display panel having a first group of leads disposed on one edge thereof, a holder bezel mounted on the frame, a printed-circuit board having a driver circuit for energizing the liquid crystal display panel, the printed-circuit board having a second group of leads, the frame being mounted on the printed-circuit board, an electrically conductive resilient spacer disposed between the liquid crystal display panel and the printed-circuit board, the first and second groups of leads being electrically connected to each other by the electrically conductive resilient spacer one edge of the liquid crystal display panel being resiliently pressed against the holder bezel by the electrically conductive resilient spacer, and a display panel support mounted on the printed-circuit board, the display panel support having a base integrally joined to the frame and a resilient wing extending from the base, the liquid crystal display panel being resiliently pressed against the holder bezel remotely from one edge by the resilient wing.

According to a second aspect of the present invention, there is provided a liquid crystal display panel assembly comprising a frame, a liquid crystal display panel housed in the frame, a holder bezel mounted on the frame, a printed-circuit board on which the frame is mounted, an electrically conductive resilient spacer disposed between the liquid crystal display panel and the printed-circuit board, the liquid crystal display panel and the printed circuit board being electrically connected to each other by the electrically conductive spacer, the liquid crystal display panel having one edge resiliently pressed against the holder bezel by said electrically conductive resilient spacer, and a display panel support mounted on the printed-circuit board, the display panel support having a base integrally connected to the frame and a resilient wing extending from the base, the liquid crystal display panel being resiliently pressed against the holder bezel remotely from and one edge by the resilient wing.

According to a third aspect of the present invention, there is provided a liquid crystal display panel assembly comprising a frame, a liquid crystal display panel housed in the frame, a holder bezel mounted on the frame, a printed-circuit board on which the frame is mounted, an electrically conductive resilient spacer disposed between the liquid crystal display panel and the printed-circuit board, the liquid crystal display panel and the printed circuit board being electrically connected to each other by the electrically conductive spacer, the liquid crystal display panel having one edge resiliently pressed against the holder bezel by the electrically conductive resilient spacer, and a display panel support mounted on the printed-circuit board, the display panel support having a base integrally formed with the frame and a resilient wing integrally extending from the base, the liquid crystal display panel being resiliently pressed against the holder bezel remotely from one edge by the resilient wing.

According to a fourth aspect of the present invention, there is provided a liquid crystal display panel assembly comprising a frame, a liquid crystal display panel housed in the frame, a board on which the frame is mounted, a resilient spacer disposed between the liquid crystal display panel and the board, for resiliently supporting the liquid crystal display panel on one side thereof, and a display panel support which is mounted on the board and includes a base integrally connected to the frame and a resilient wing extending from said base, the resilient wing supporting the liquid crystal display panel on the other side thereof.

According to a fifth aspect of the present invention, there is provided a liquid crystal display panel assembly comprising a frame, a liquid crystal display panel housed in the frame, a board on which the frame is mounted, a resilient spacer disposed between the liquid crystal display panel and the board, for resiliently supporting the liquid crystal display panel on one side thereof, and a display panel support which is mounted on the board and includes a base integrally formed with the frame and a resilient wing integrally extending from the base, the resilient wing supporting the liquid crystal display panel on the other side thereof.

The display panel support is positioned in the frame. The resilient wing extends in a cantilevered manner from the base, and has a presser ridge disposed on an edge thereof remote from the base. More specifically, the resilient wing extends progressively away from the printed-circuit board in a direction away from the base in overhanging relationship to the printed-circuit board. The presser ridge is held in pressing engagement with an edge of the liquid crystal display panel remote from one edge.

The presser ridge may extend fully along the edge of the resilient wing remote from the base, or may comprise a pair of spaced presser ridge members disposed on respective ends of the edge of the resilient-wing remote from the base.

The above and other objects, features, and advantages of the present invention will become apparent from the following description, when taken in conjunction with the accompanying drawings, which illustrate preferred embodiments of the present invention by way of example.

DETAILED DESCRIPTION OF THE PREFERRED EMBODIMENTS

Figure 1:
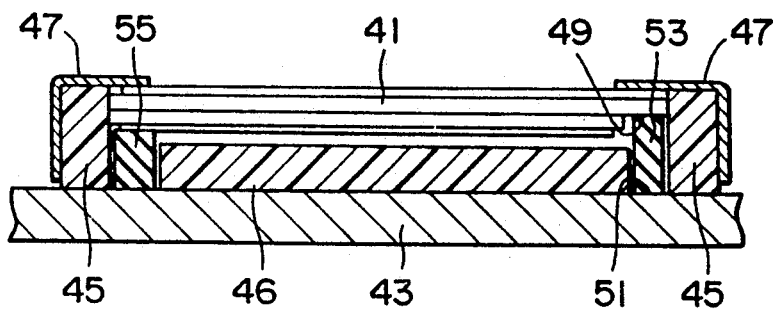
FIG. 1 is a cross-sectional view of a conventional liquid crystal display panel assembly.
Figure 2:
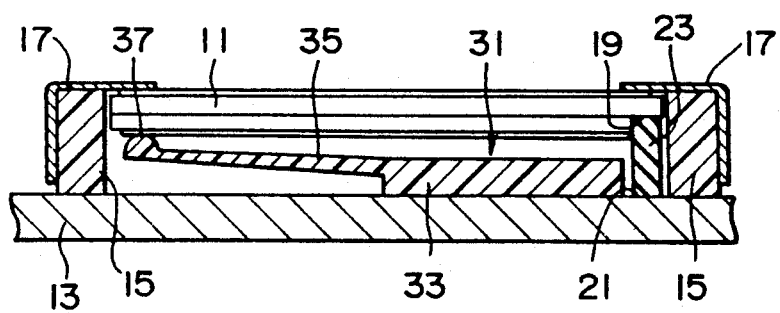
FIG. 2 is a cross-sectional view of a liquid crystal display panel assembly according to an embodiment of the present invention.

FIG. 2 shows in cross section a liquid crystal display panel assembly according to one embodiment of the present invention. As shown in FIG. 2, the liquid crystal display panel assembly generally comprises a liquid crystal display panel 11 and a printed-circuit board 13 that includes a liquid crystal driver circuit for energizing the liquid crystal display panel 11 to display information.

The liquid crystal display panel 11 is housed in a centrally open rectangular frame 15 fixedly mounted on the printed-circuit board 13. A centrally open rectangular holder bezel 17 of L-shaped cross section is mounted on an upper surface of the frame 15.

The liquid crystal display panel 11 has a first group of leads 19 on the lower surface of one edge thereof, and the printed-circuit board 13 also has a second group of leads 21 on the upper surface thereof in vertical alignment with the leads 19. Between the leads 19 and the leads 21, there is disposed a connector or spacer 23 of electrically conductive rubber that resiliently presses the liquid crystal display panel 11 against an inner peripheral edge of the holder bezel 17 which extends inwardly of the frame 15. Leads 19 and leads 21 which are vertically aligned are held in electric contact with each other through the conductive spacer 23, which at the same time provides electric insulation between leads 19 and the leads 21 which are adjacent one another.

Figure 3:
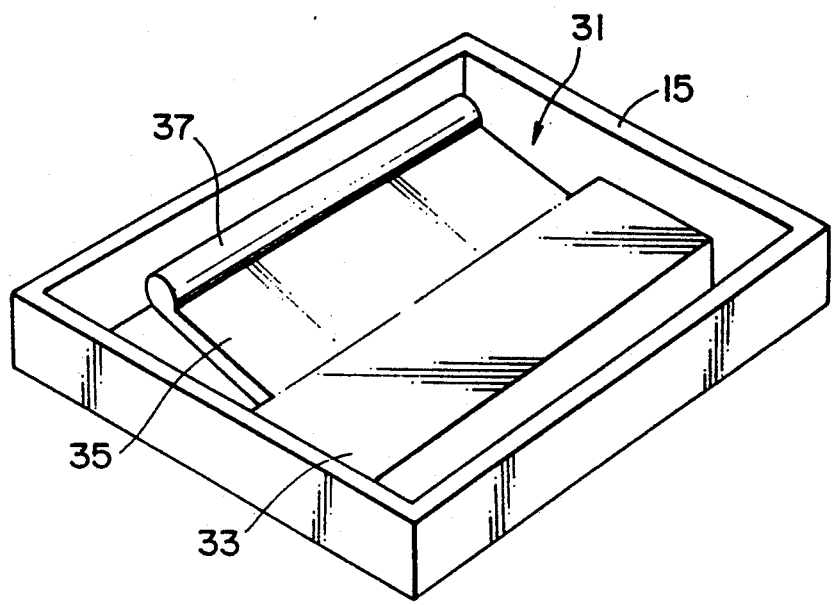
FIG. 3 is a perspective view of a display panel support of the liquid crystal display panel assembly shown in FIG. 2.

A display panel support 31 is disposed in the frame 15 and positioned between the liquid crystal display panel 11 and the printed-circuit board 13. As shown in FIG. 3, the display panel support 31 has a base 33 mounted on the printed-circuit board 13 and integrally joined at opposite ends thereof to the frame 15, making the frame 15 rigid against strains for protection of the liquid crystal display panel 11 from undesirable distortions or deformations. The spacer 23 is positioned adjacent to the base 33 of the display panel support 31.

The display panel support 31 also includes a cantilevered resilient wing 35 extending slightly obliquely upwardly from the base 33, i.e., progressively away from the printed-circuit board 43 in a direction away from the base 33, in overhanging relationship to the printed-circuit board 43. The resilient wing 35 has a presser ridge 37 of a semicircular cross section disposed on and extending fully along an edge thereof remote from the base 33. The presser ridge 37 has a length which is substantially the same as the width of the liquid crystal display panel 11. The presser ridge 37 is held in resiliently pressing engagement with the lower surface of an edge of the liquid crystal display panel 11 remote from the leads 19, under the resiliency of the resilient wing 35, thereby pressing the edge of the liquid crystal display panel 11 against an inner peripheral edge of the holder bezel 17 which extends inwardly of the frame 15.

The opposite edges of the liquid crystal display panel 11 are therefore resiliently pressed upwardly against the holder bezel 17 by the spacer 23 and the presser 37, respectively.

Since the edge of the liquid crystal display panel 11, remote from the leads 19, is resiliently pressed against the holder bezel 17 by the presser 37 of the support display panel 31, no additional dummy connector or spacer is required to hold the liquid crystal display panel 11 in position. Therefore, the liquid crystal display panel assembly is composed of a relatively small number of parts, can be assembled with ease, and is relatively inexpensive to manufacture.

It would be clear that the present invention is not limited to the embodiment described above, nor those illustrated in the drawings, and the invention can be modified without departing from the spirit and scope of the claimed invention.

Figure 4:
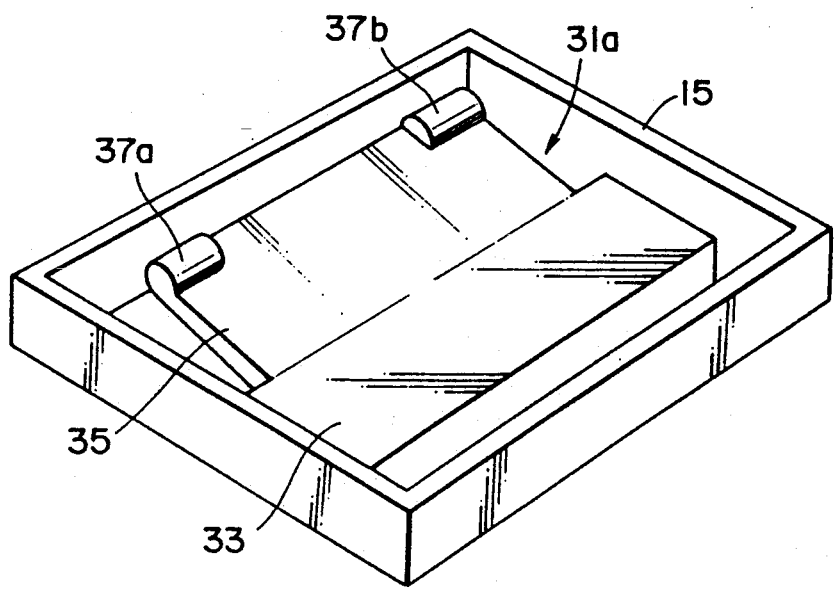
FIG. 4 is a perspective view of a modified display panel support.

FIG. 4 shows a modified display panel support 31a. The display panel support 31a has a pair of spaced presser ridge members 37a, 37b of a semicircular cross section disposed on respective opposite ends of the edge of the resilient wing 35 remote from the base 33. The presser ridges 37a, 37b serve to press the liquid crystal display panel 11 against the holder bezel 17 under the bias of the resilient wing 35.

Figure 5:
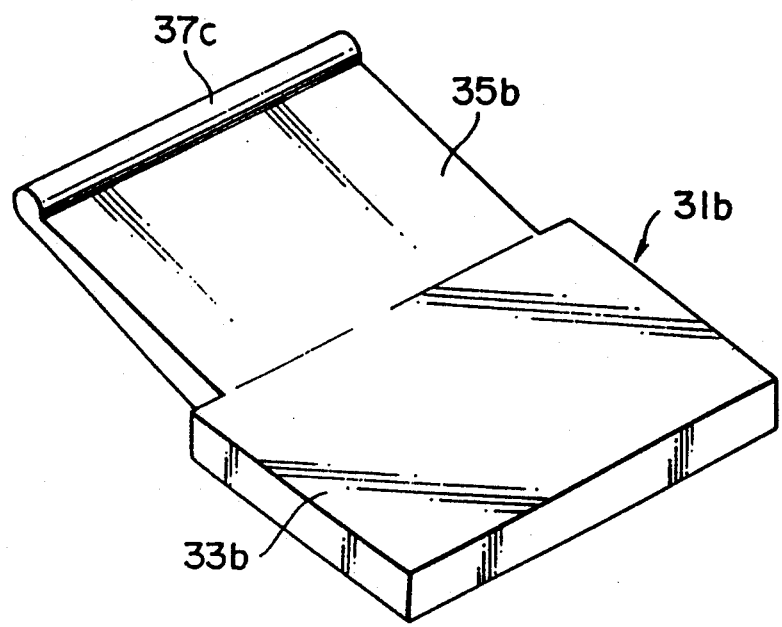
FIG. 5 is a perspective view of a further modified display panel support.
Figure 6:
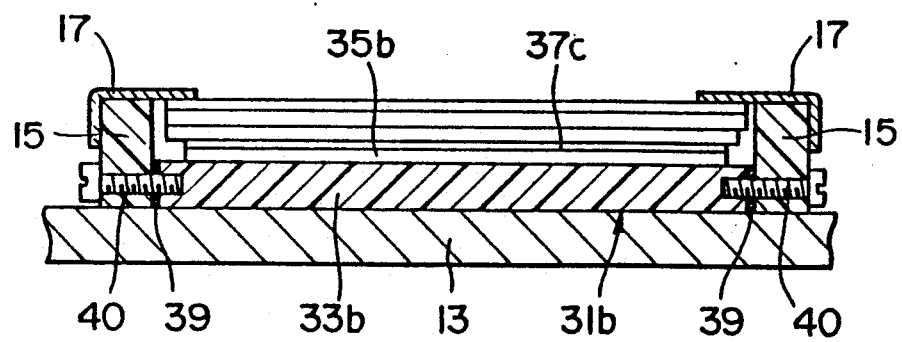
FIG. 6 is a sectional view of the further modified liquid crystal display panel assembly.

FIGS. 5 and 6 show a further modified display panel support 31b. The display panel support 31b exists separately or independently from the frame 15 as shown in FIG. 5, but is fixed to the frame 15 by, for example, adhesive 39 and/or fixing screws 40 as shown in FIG. 6.

The present disclosure relates to subject matter contained in Japanese Utility Model Application No. HEI 03-100070 filed on Sep. 30, 1991.

What is claimed is:

1. A liquid crystal display panel assembly comprising:
   a frame;
   a liquid crystal display panel housed in said frame, said liquid crystal display panel having a first group of leads disposed on one edge thereof;
   a holder bezel mounted on said frame;
   a printed-circuit board having a driver circuit for energizing said liquid crystal display panel, said printed-circuit board having a second group of leads, said frame being mounted on said printed-circuit board;
   an electrically conductive resilient spacer disposed between said liquid crystal display panel and said printed-circuit board, said first and second groups of leads being electrically connected to each other by said electrically conductive spacer, said one edge of the liquid crystal display panel being resiliently pressed against said holder bezel by said electrically conductive resilient spacer; and
   a display panel support mounted on said printed-circuit board, said display panel support having a base integrally joined to said frame and a resilient wing extending from said base, said liquid crystal display panel being resiliently pressed against said holder bezel remotely from said one edge by said resilient wing.

2. The liquid crystal display panel assembly according to claim 1, wherein
   said display panel support is positioned in said frame.

3. The liquid crystal display panel assembly according to claim 1, wherein
   said resilient wing extends in a cantilevered manner from said base, said resilient wing comprising a presser ridge disposed on an edge thereof remote from said base, said presser ridge being held in pressing engagement with an edge of said liquid crystal display panel remote from said one edge.

4. The liquid crystal display panel assembly according to claim 3, wherein
   said presser ridge extends fully along said edge of said resilient wing remote from said base.

5. The liquid crystal display panel assembly according to claim 3, wherein
   said presser ridge comprises a pair of spaced presser ridge members disposed on respective ends of said edge of said resilient wing remote from said base.

6. The liquid crystal display panel assembly according to claim 3, wherein
   said resilient wing extends progressively away from said printed-circuit board in a direction away from said base in overhanging relationship to said printed-circuit board.

7. A liquid crystal display panel assembly comprising:
   a frame;
   a liquid crystal display panel housed in said frame;
   a holder bezel mounted on said frame;
   a printed-circuit board on which said frame is mounted;
   an electrically conductive resilient spacer disposed between said liquid crystal display panel and said printed-circuit board, said liquid crystal display panel and said printed circuit board being electrically connected to each other by said electrically conductive spacer, said liquid crystal display panel having one edge resiliently pressed against said holder bezel by said electrically conductive resilient spacer; and
   a display panel support mounted on said printed-circuit board, said display panel support having a base integrally connected to said frame and a resilient wing extending from said base, said liquid crystal display panel being resiliently pressed against said holder bezel remotely from said one edge by said resilient wing.

8. A liquid crystal display panel assembly comprising:
   a frame;
   a liquid crystal display panel housed in said frame;
   a holder bezel mounted on said frame;
   a printed-circuit board on which said frame is mounted;
   an electrically conductive resilient spacer disposed between said liquid crystal display panel and said printed-circuit board, said liquid crystal display panel and said printed circuit board being electrically connected to each other by said electrically conductive spacer, said liquid crystal display panel having one edge resiliently pressed against said holder bezel by said electrically conductive resilient spacer; and
   a display panel support mounted on said printed-circuit board, said display panel support having a base integrally formed with said frame and a resilient wing integrally extending from said base, said liquid crystal display panel being resiliently pressed against said holder bezel remotely from said one edge by said resilient wing.

9. A liquid crystal display panel assembly comprising:
   a frame;
   a liquid crystal display panel housed in said frame;
   a board on which said frame is mounted;
   a resilient spacer disposed between said liquid crystal display panel and said board, for resiliently supporting said liquid crystal display panel along a portion of a periphery thereof; and
   a display panel support which is mounted on said board and includes a base integrally connected to said frame and a resilient wing extending from said base, said resilient wing supporting said liquid crystal display panel along a portion of said periphery opposite said resilient spacer.

10. A liquid crystal display panel assembly comprising:
    a frame;
    a liquid crystal display panel housed in said frame;
    a board on which said frame is mounted;

a resilient spacer disposed between said liquid crystal display panel and said board, for resiliently supporting said liquid crystal display panel along a portion of a periphery thereof; and a display panel support which is mounted on said board and includes a base integrally formed with said frame and a resilient wing integrally extending from said base, said resilient wing supporting said liquid crystal display panel along a portion of said periphery opposite said resilient spacer.

* * * * *